United States Patent
Rump et al.

(10) Patent No.: US 11,532,422 B2
(45) Date of Patent: Dec. 20, 2022

(54) COIL CORE IN THE FORM OF A FERROMAGNETIC RIVET FOR SPIRAL INDUCTORS ON PRINTED CIRCUIT BOARDS

(71) Applicant: BIOTRONIK SE & CO. KG, Berlin (DE)

(72) Inventors: Jens Rump, Berlin (DE); Christian Moss, Berlin (DE)

(73) Assignee: BIOTRONIK SE & Co. KG, Berlin (DE)

( * ) Notice: Subject to any disclaimer, the term of this patent is extended or adjusted under 35 U.S.C. 154(b) by 930 days.

(21) Appl. No.: 16/375,158

(22) Filed: Apr. 4, 2019

(65) Prior Publication Data

US 2019/0311839 A1 Oct. 10, 2019

(30) Foreign Application Priority Data

Apr. 4, 2018 (EP) .................................... 18165616

(51) Int. Cl.
| | |
|---|---|
| H01F 27/26 | (2006.01) |
| H02J 50/10 | (2016.01) |
| H01F 27/28 | (2006.01) |
| H03H 7/38 | (2006.01) |
| H05K 1/02 | (2006.01) |
| H05K 1/16 | (2006.01) |
| H01F 17/00 | (2006.01) |
| H01F 38/14 | (2006.01) |

(52) U.S. Cl.
CPC ....... *H01F 27/266* (2013.01); *H01F 27/2804* (2013.01); *H02J 50/10* (2016.02); *H03H 7/38* (2013.01); *H05K 1/0277* (2013.01); *H05K 1/165* (2013.01); *H01F 38/14* (2013.01); *H01F 2017/006* (2013.01)

(58) Field of Classification Search
CPC ............. H01F 2017/006; H01F 27/266; H01F 27/2804; H01F 38/14; H01F 3/00; H01F 5/003; H01F 17/0006; H01F 17/0033; H01F 17/04; H01F 27/24; H01F 27/26; H01F 27/263; H02J 50/10; H05K 1/165
See application file for complete search history.

(56) References Cited

U.S. PATENT DOCUMENTS

| | | | | |
|---|---|---|---|---|
| 2012/0130206 A1* | 5/2012 | Vajha | ....................... | H01Q 1/36 |
| | | | | 607/60 |
| 2014/0002225 A1* | 1/2014 | Konanur | ................. | H01F 5/003 |
| | | | | 336/200 |

FOREIGN PATENT DOCUMENTS

| | | | |
|---|---|---|---|
| EP | 3128672 A1 * | 2/2017 | ........... H01Q 1/3275 |
| JP | 05090028 A | 4/1993 | |

(Continued)

OTHER PUBLICATIONS

Ostfeld, Aminy E., et al. "Screen printed passive components for flexible power electronics." Scientific reports 5.1 (2015): 1-11. (Year: 2015).*

(Continued)

*Primary Examiner* — Ryan Johnson
(74) *Attorney, Agent, or Firm* — Laurence A. Greenberg; Werner H. Stemer; Ralph E. Locher

(57) ABSTRACT

An assembly includes an electromagnetic coil with a conductor, and a substrate on which the conductor is arranged. The coil has a core and the conductor extends around the core. The core is formed by a ferromagnetic rivet that is fastened to the substrate.

20 Claims, 8 Drawing Sheets

(56) References Cited

FOREIGN PATENT DOCUMENTS

JP          H0590028 A   *  4/1993
WO     2013010455 A1    1/2013

OTHER PUBLICATIONS

Pengli, Zhu, Wu Yanmin, and Sun Rong. "Synthesis and magnetic properties of Ni—Zn ferrite@ polyaniline/epoxy composites for embedded inductor applications." 2011 International Symposium on Advanced Packaging Materials (APM). IEEE, 2011. (Year: 2011).*

* cited by examiner

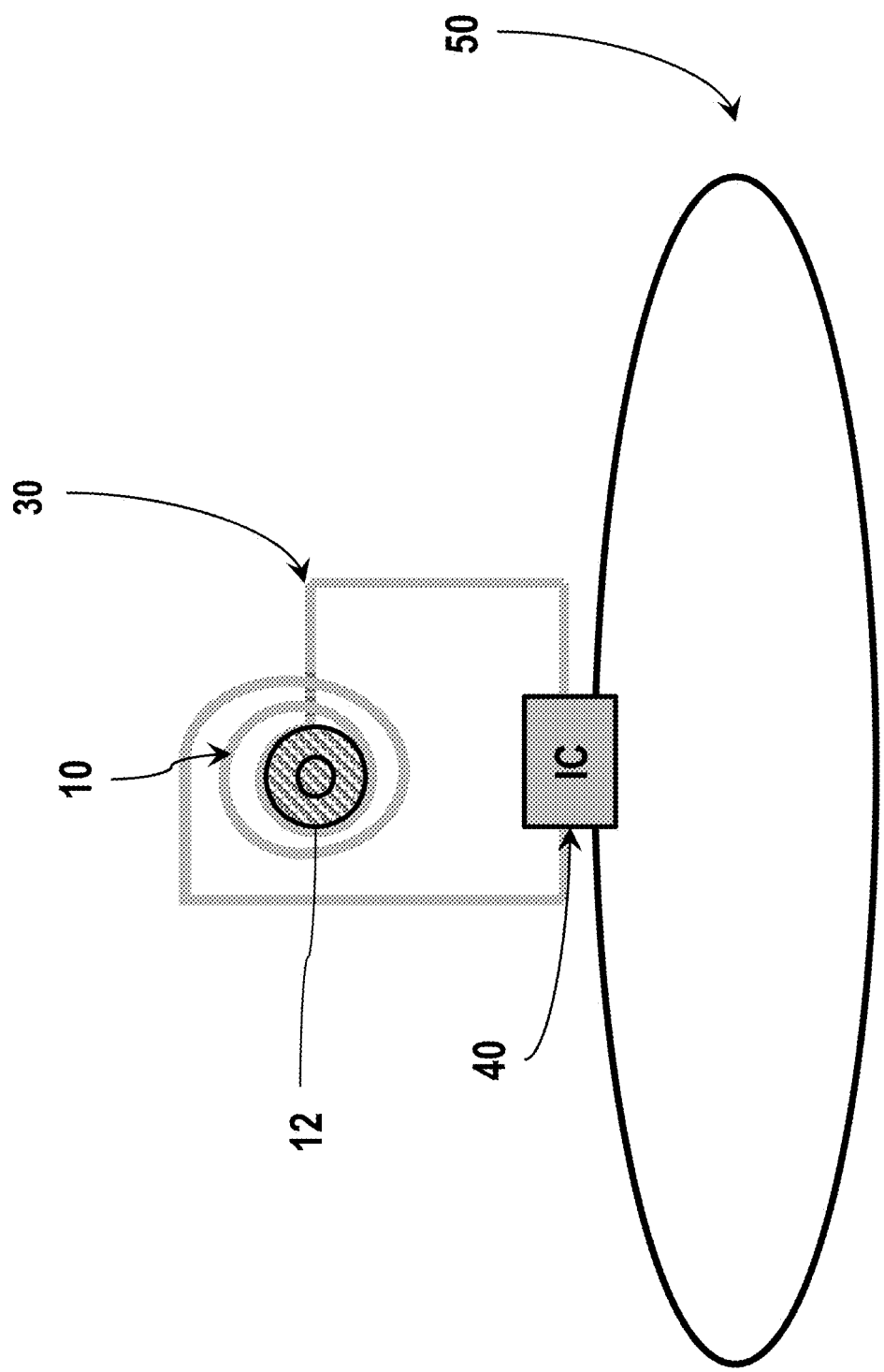

COIL CORE IN THE FORM OF A FERROMAGNETIC RIVET FOR SPIRAL INDUCTORS ON PRINTED CIRCUIT BOARDS

CROSS-REFERENCE TO RELATED APPLICATION

This application claims the priority, under 35 U.S.C. § 119, of European patent application EP 18165616, filed Apr. 4, 2018; the prior application is herewith incorporated by reference in its entirety.

BACKGROUND OF THE INVENTION

Field of the Invention

Flat spiral inductors are particularly used on flexible conductor boards (e.g. printed circuit boards), particularly for impedance matching or for forming a spiral antenna.

In order to increase the inductance of such a flat spiral, it is possible to either increase the diameter or the number of windings, or, according to a further possibility, to use ferromagnetic and electrically non-conductive materials in the vicinity of the coil as a (e.g. ferrite) core. In the case of cylindrical coils, such a core can be designed rather easily and is widely used.

In the case of flat spiral-shaped inductors/coils on conductor boards, providing ferromagnetic cores is rather difficult and thus ferromagnetic cores are rarely used with such coils on conductor boards. In the state of the art, doping the substrate material or using a coating of the coil with a ferromagnetic material is predominantly used.

However, said doping changes the mechanical properties of the substrate material and the possible density of the ferromagnetic material is limited. Furthermore, coating the coil is expensive and the thickness of the coating is limited to a few micrometers depending on the coating process used.

BRIEF SUMMARY OF THE INVENTION

It is accordingly an object of the invention to provide a device, which overcomes the above-mentioned and other disadvantages of the heretofore-known devices and methods of this general type and which provides for a solution to the above difficulties.

With the foregoing and other objects in view there is provided, in accordance with the invention, an assembly, comprising
 a substrate;
 an electromagnetic coil having a core and a conductor extending along or around said core; and
 said core being a ferromagnetic rivet fastened to said substrate.

In other words, the novel assembly comprises an electromagnetic coil with a conductor, and a substrate on which the conductor is arranged. The coil comprises a core, wherein the conductor extends along or around the core, and wherein the core is formed by a ferromagnetic rivet that is fastened to the substrate.

Thus, the present method uses a way to increase the inductance which is simpler than previous methods and allows applying larger amounts of effective ferromagnetic material for increasing inductance. Particularly, according to the present invention, a ferromagnetic rivet is used, which can be joined and pressed through the middle of the e.g. flat and spiral coil.

Particularly in case the outer dimensions of the e.g. spiral coil are limited and thus the outer diameter and the number of windings can only be increased to a limited extent, the use of a ferromagnetic core is highly beneficial. Thus, according to the present invention, there is no need to decrease the stability of the substrate material by doping it. Thus, an affordable realization of large and flat inductors having a small form factor at the same time can be achieved by way of the present invention.

Particularly, according to an embodiment, the length l of the inductor/coil is significantly smaller than its diameter d ($l \ll d$), so that particularly the ferromagnetic and electrically non-conducting rivet forming the core of the coil generates an inductance that is significantly larger than the inductance of the same coil having an air core instead.

Particularly, according to an embodiment of the assembly according to the present invention, the conductor of the coil forms a spiral.

Particularly, according to an embodiment of the assembly according to the present invention, the substrate is a conductor plate, wherein said conductor is formed by at least one conductive path arranged on the substrate. Particularly, the substrate is a printed circuit board and the conductive path is a printed circuit board track.

According to a further embodiment of the assembly, the conductive path is arranged on a first side (e.g. upper side) of the substrate, wherein the conductor comprises a further conductive path arranged on a second side (e.g. lower side) of the substrate, which second side faces away from the first side. Particularly, the two conductive paths are electrically connected, e.g. by means of a through-connection such as a VIA (vertical interconnect access).

Further, according to an embodiment of the assembly according to the present invention, the substrate is a flexible substrate.

Particularly, in case of very thin flexible substrates that are used to achieve a form factor that is as small as possible, the application of an inductive element integrated into the substrate in the form of a rivet is very reasonable. In such a design, the number of windings of the coil is strongly limited, since a planar design only allows a small number of layers in contrast to a coil made out of a wound wire.

Furthermore, a large number of windings leads to an unwanted high parasitic capacitance and thus to a reduced resonance frequency of the coil. This is of particular importance in case of higher frequencies. For this reason, the application of a ferromagnetic rivet core is advantageous since it allows increasing the inductance.

Further, according to an embodiment of the assembly according to the present invention, the substrate can comprise a thickness in the range from 25 μm to 300 μm, particularly 50 μm. The conductive path can have a thickness in the range from 1 μm to 50 μm. In a particularly suitable embodiment it has a thickness of 3 μm.

Further, according to an embodiment of the assembly according to the present invention, the substrate can e.g. be formed out of a polyimide, a rigid glass material, a low temperature co-fired ceramic, a high temperature co-fired ceramic or a liquid crystal polymer. Other possible materials are polyester or polytetrafluorethylene.

Further, according to an embodiment of the assembly according to the present invention, the rivet comprises ferromagnetic particles embedded in a carrier material, wherein particularly the carrier material is a plastically deformable material.

Further, according to an embodiment of the assembly according to the present invention, the ferromagnetic material of the rivet or said particles comprise or consist of one of the following materials: AlNiCo, SmCo, $Nd_2Fe_{14}B$, $Ni_{80}Fe_{20}$ (so-called Permalloy), a NiFeCo alloy (so-called Mu-metal), a manganese-zinc ferrite, $Mn_aZn_{(1-a)}Fe_2O_4$, a nickel-zinc ferrite, $Ni_aZn_{(1-a)}Fe_2O_4$.

Particularly, as a carrier material, a plastically deformable and electrically non-conductive plastic material (e.g. polymer) can be used, particularly a liquid crystal polymer, that can be plastically deformed by applying heat and thereby joined e.g. with a liquid crystal polymer of the substrate. The rivet may comprise at least one part that is not plastically deformed, which part can also be formed out of a ceramic material.

Further, according to an embodiment of the assembly according to the present invention, the rivet is a solid rivet comprising a rivet pin connected to a rivet cap e.g. by a riveting process (e.g. self-piercing riveting).

Further, according to an embodiment of the assembly according to the present invention, the rivet is a semi-tubular rivet (also known in the art as mushroom head rivet or countersunk head rivet) comprising a rivet pin connected to a rivet cap e.g. by a riveting process (e.g. self-piercing riveting). Particularly, the rivet cap is a rivet mandrel used to deform a plastically deformable head of the rivet pin at a hollow end of the rivet pin.

Further, according to an embodiment of the assembly according to the present invention, the rivet is a semi-tubular rivet pin (here no rivet cap is needed) comprising a plastically deformable rivet head at a hollow end of the rivet pin. The head is deformed for riveting the rivet to the substrate by means of a separate tool comprising a mandrel for deforming the head of the rivet pin.

Further, according to an embodiment of the assembly according to the present invention, the respective rivet is connected to the substrate by means of self-piercing riveting (or another suitable riveting technique).

Further, according to an embodiment of the assembly according to the present invention, the rivet pin can comprise a diameter in the range from 1 mm to 3 mm, particularly 1.5 mm, and a length in the range from 100 μm to 300 μm, particularly 200 μm. Furthermore, the rivet cap can comprise a diameter in the range from 1.5 mm to 3.5 mm, particularly 2 mm, and a thickness in the range from 25 μm to 75 μm, particularly 50 μm.

Further, according to an embodiment of the assembly according to the present invention, the assembly comprises an impedance matching means (e.g. an impedance matching network or an impedance matching circuit) comprising or formed by said electromagnetic coil having the ferromagnetic core.

Further, according to an embodiment of the assembly according to the present invention, the assembly comprises an antenna structure and an integrated circuit, wherein said impedance matching means is configured for impedance matching of the antenna structure with respect to the integrated circuit.

Further, according to an embodiment of the assembly according to the present invention, the antenna structure and/or said integrated circuit is arranged on said substrate of the assembly.

Such an application of a ferromagnetic rivet according to the present invention is of particular interest concerning an automatic lead recognition using an (e.g. miniature) device arranged on the implantable lead to be recognized, which device comprises the integrated circuit that is configured to contain information about the implantable lead (such as e.g. a serial number of the lead, admission restrictions, etc.).

Further, according to an embodiment, the integrated circuit is configured to be provided with energy in a wireless fashion by a medical implant that uses said lead, wherein the implant is particularly configured to provide said energy via an antenna of said implant. Further, particularly, the implant is configured to read said information stored in the integrated circuit using, for example, UHF-RFID technology.

According to yet another aspect of the present invention, a lead is disclosed, the lead comprising an assembly according to the present invention (e.g. for impedance matching, see above), particularly for automatic recognition of the lead by an implant using the lead.

Further, according to an alternative embodiment of the assembly according to the present invention, the assembly comprises an antenna formed by the electromagnetic coil or comprising the electromagnetic coil.

Further, according to an alternative embodiment of the assembly according to the present invention, the assembly is configured to use the electromagnetic coil for inductive energy and/or data transmission.

According to yet another aspect of the present invention, a medical device is disclosed, wherein the medical device comprises an assembly according to the present invention. This medical device is preferably implantable.

The medical device that comprises an assembly according to the present invention is preferably a pacemaker, a defibrillator, a neurostimulator, a cochlear implant or a retina implant.

The assembly of the invention is particularly suitable for a medical device because of its high mechanical stability. Medical devices are usually implanted into a patient for years and subject to many shocks during their life time. High mechanical stability over a long life time is therefore necessary for such implants. The fixation of a magnetic core to a substrate by a rivet offers a more mechanically stable solution than fixation through brazing or by an adhesive. This is particularly the case if the substrate of the medical device is subject to bending during use. A further advantage of a medical device with the assembly according to the invention is its reduced manufacturing costs. Ferromagnetic cores are usually fixated onto the substrate by use of a solder or an adhesive. In contrast, when using a rivet, no additional material has to be deposited on the substrate in order to fixate the ferromagnetic core of the substrate. The use of a rivet as a ferromagnetic core also allows further miniaturization of the device.

A further advantage of using a rivet as opposed to solder is that the substrate does not need to be thermally treated in order to fixate the magnetic core onto the substrate, since the riveting process can be performed at ambient temperature. Components that are sensitive to high temperatures can therefore be incorporated without the risk of them being damaged during the soldering process.

According to one embodiment, the medical device comprises a housing and the assembly according to the invention is located inside the housing of the medical device. Such a housing can be made of titanium and is configured to be water tight. The advantage of this configuration is that the assembly is not exposed to corrosive bodily fluids.

In an alternative embodiment however, the medical device does not comprise a housing or the assembly is located outside of the housing. This is possible because the assembly can be configured to be biocompatible. One way of achieving this is to provide an assembly that is entirely embedded in a biocompatible matrix. Another option is to provide an assembly in which the ferromagnetic particles of the core are embedded into a biocompatible matrix and the substrate is made of a biocompatible material such as LCP. In this embodiment, the leads do not necessarily have to be made of a biocompatible material. This is possible if the rivet head and cap are configured to entirely enclose the lead between the rivet and the substrate in a water tight manner. As a result, the lead is kept from interacting with the body environment and the assembly is biocompatible.

In one embodiment, the assembly of the invention is configured as a Medical Implant Communication Service (MICS) antenna that is preferably incorporated into the header of the implant. This is particularly advantageous because the assembly according to the invention is MRT-compatible. The strong static magnetic field of the MRT leads to saturation of the magnetic flow inside of the ferromagnet. The assembly comprising the coil and the ferrogmagnetic core therefore effectively behaves as a coil with an air core during MRT examination. This leads to the resonance frequency of the antenna being significantly raised, which in turn leads to a strong reduction of the unfavorable interaction between the radiofrequency pulses inside of the MRT and the implant. Without the saturation effect of the ferromagnetic core, the coil would overheat.

Other features which are considered as characteristic for the invention are set forth in the appended claims.

Although the invention is illustrated and described herein as embodied in a coil core in the form of a ferromagnetic rivet for spiral inductors on printed circuit boards, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 8 shows an assembly according to the invention comprising an antenna structure and an integrated circuit.

DETAILED DESCRIPTION OF THE INVENTION

Figure 1:
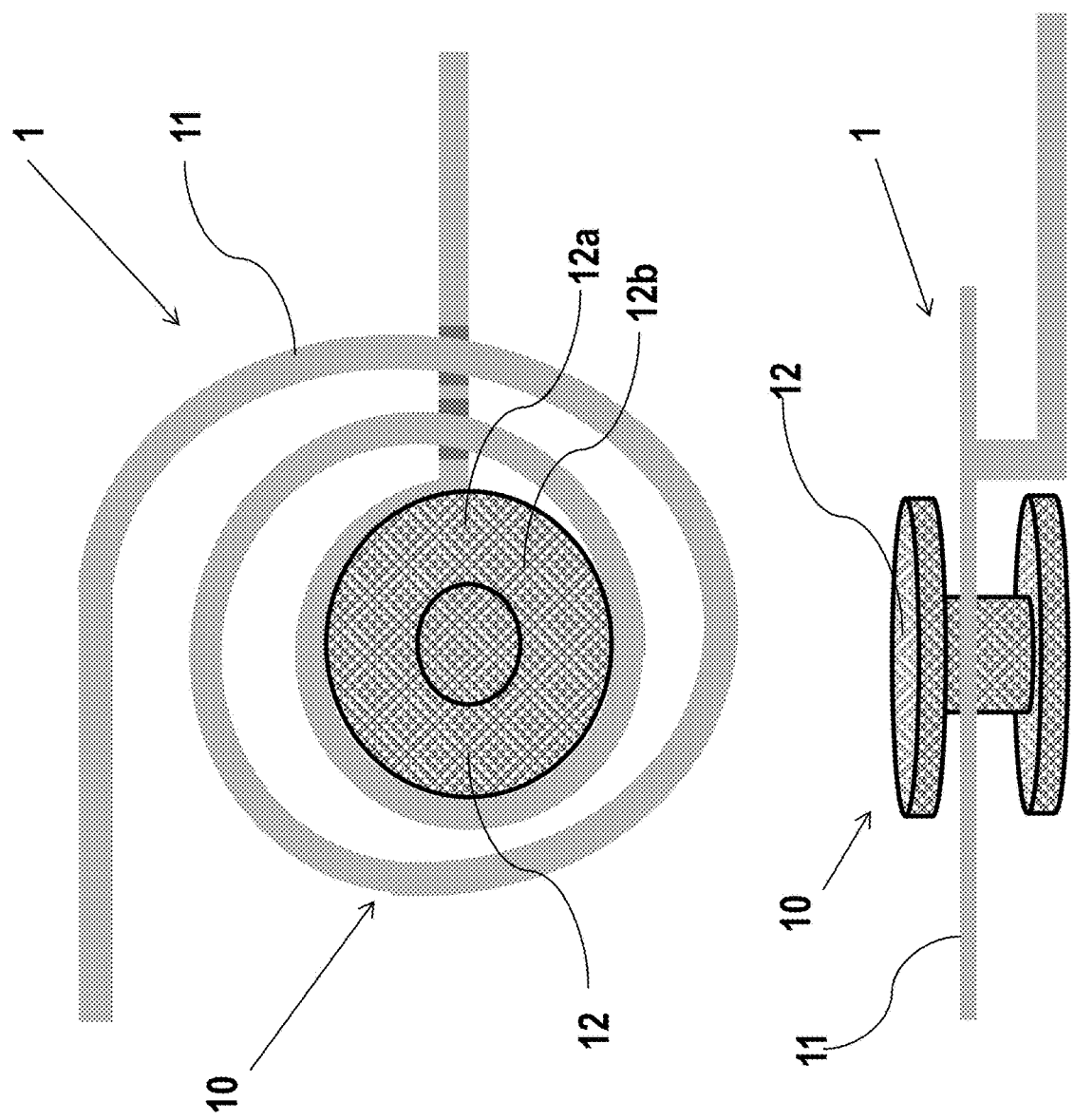
FIG. 1 shows a schematic top view onto an embodiment of an assembly according to the present invention (upper part) and a schematic lateral view of the assembly (lower part)

Referring now to the figures of the drawing in detail and first, particularly, to FIG. 1 thereof, there is shown a schematic illustration of an assembly 1 according to the present invention. The assembly comprises an electromagnetic coil 10 with a conductor 11, and a substrate (not shown, see below) on which the conductor 11 is arranged. The coil 10 comprises a core 12 and the conductor 10 extends along or around the core 12. The core 12 is formed by a ferromagnetic rivet 12 fastened to the substrate. Particularly, the conductor 11 of the coil 10 forms a spiral, as indicated in the top view in the upper part of FIG. 1

Figure 5:
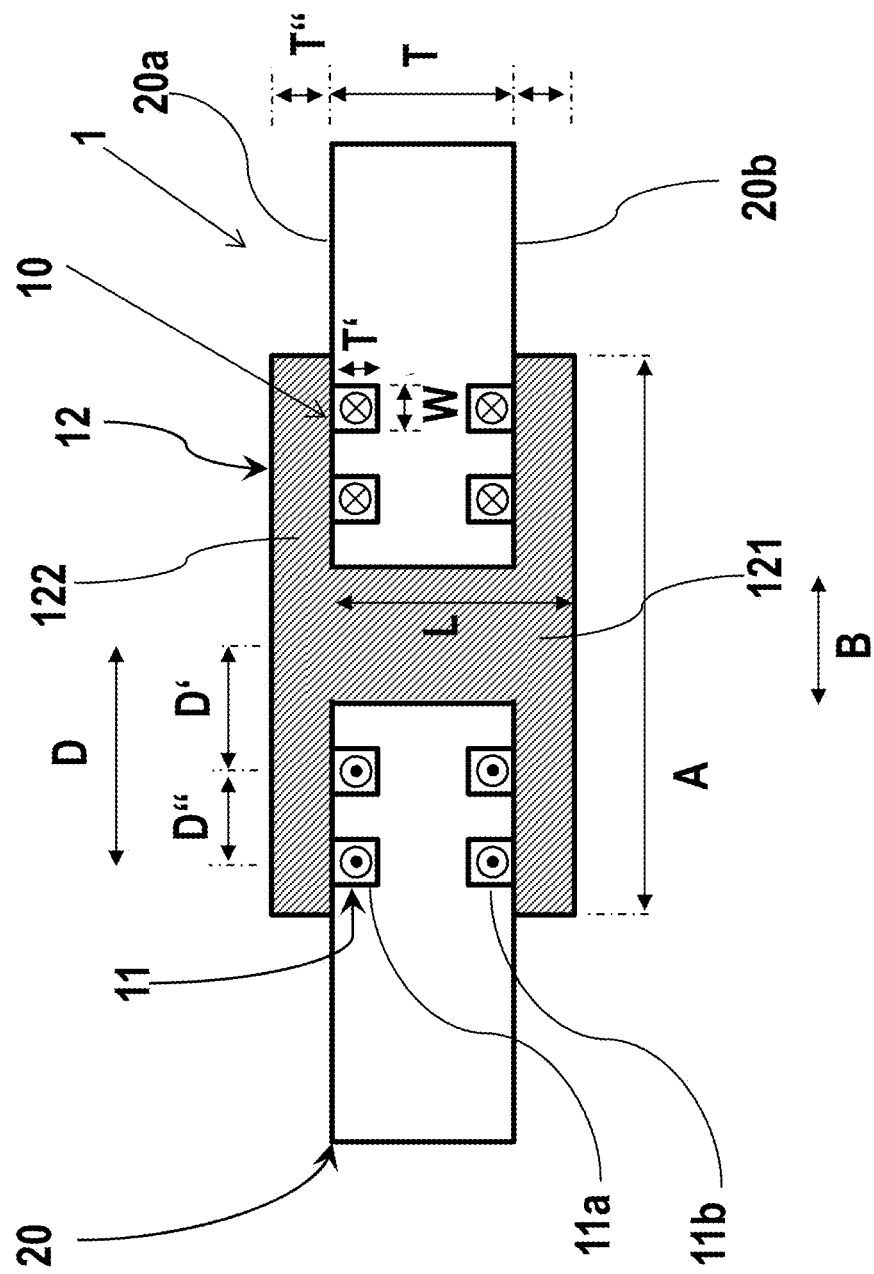
FIG. 5 shows a schematic cross sectional view of yet another embodiment of an assembly according to the present invention.

FIG. 5 shows a further embodiment of an assembly 1 according to the present invention. Particularly, the substrate 20 can be a flexible conductor plate formed, for example, out of polyimide (PI) or a liquid crystal polymer (LCP) and may have a thickness T of 50 μm. The conductor 11 can comprise or can be formed by a conductive path 11a in form of a gold coating of the substrate 20, wherein the conductive path 11a may have a thickness T' of e.g. 3 μm and may form on a first side 20a of the substrate 20 a spiral having two windings, wherein the conductive path 11a can have a width W of e.g. 50 μm, and a conductive path distance D" of e.g. 50 μm, an outer diameter D of e.g. 2 mm, and an inner diameter D' of e.g. 1.8 mm. In the internal diameter (e.g. center) of the spiral 11a, the conductor 11 is passed via a through-connection (e.g., VIA) to the other second side 20b of the substrate 20, where the conductor 11 may also comprise a conductive path 11b in form of a spiral (i.e., as described above).

Further, the coil 10 comprises a core 12 in the form of a ferromagnetic solid rivet 12 comprising a rivet pin 121 having a diameter B of e.g. 1.5 mm, and a length L of e.g. 200 μm as well as a rivet cap 122 having a diameter A of e.g. 2 mm and a thickness T" of e.g. 100 μm.

Figure 2:
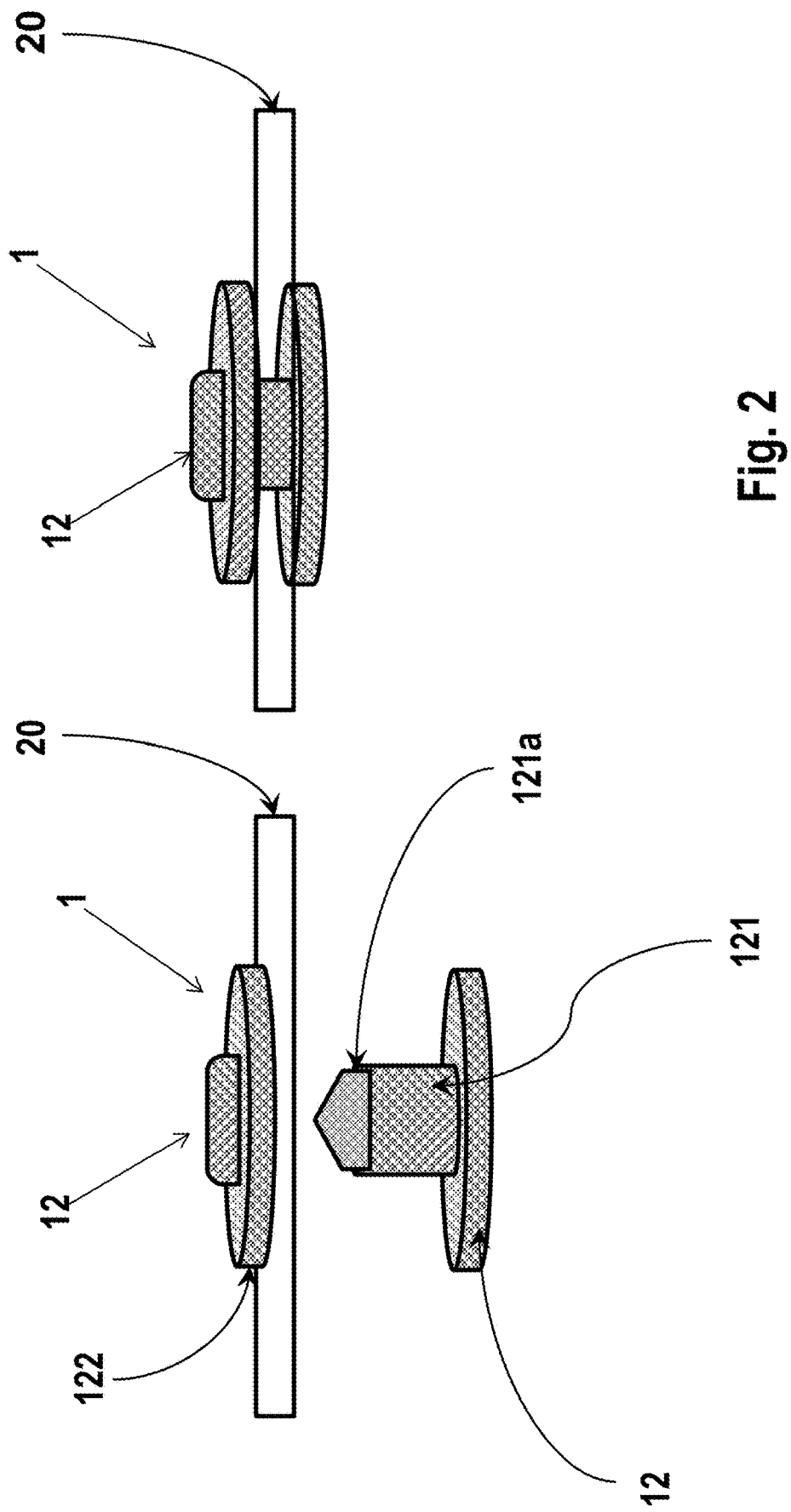
FIG. 2 shows a schematic view of a coil core in the form of a ferromagnetic rivet in two different states, namely before riveting a rivet pin to a rivet cap of the rivet (and thereby the rivet to the substrate) on the left-hand side of FIG. 2 as well as the rivet when it is riveted to the substrate (right-hand side of FIG. 2)

The rivet pin and cap 121, 122 is connected to the substrate 20 in a form-fitting manner by means of self-piercing riveting such that the rivet pin 121 extends through the substrate 20. The riveting process is illustrated for a solid rivet 12 in FIG. 2. According thereto, the rivet cap 122 is initially arranged on the first side 20a of the substrate 20 and the rivet pin 121 is arranged on the second side 20b of the substrate 20 as indicated on the left-hand side of FIG. 2 (it should be clear that the position of the pin 121 and the cap 122 can also be interchanged). The rivet pin 121 comprises a plastically deformable head 121a to be joined to the cap 122. Upon riveting, the substrate 20 is penetrated by the rivet pin 121 and the head 121a of the rivet pin 121 is deformed and joined to the rivet cap 122 so that the ferromagnetic rivet 12 is fastened to the substrate 20 as shown on the right-hand side of FIG. 2. In case a more rigid substrate 20 is used, the substrate 20 can also be provided with a bore for receiving the rivet pin 121.

The inductor 10 can e.g. be part of an impedance matching network for impedance matching of an antenna structure with respect to an integrated circuit (IC), e.g. as described above. The coil 10 may also be used as an antenna or alternative for inductive transport of energy and/or data.

Instead of a solid rivet, it is also possible for semi-hollow rivets 12 to be used in the above described embodiments.

Figure 3:
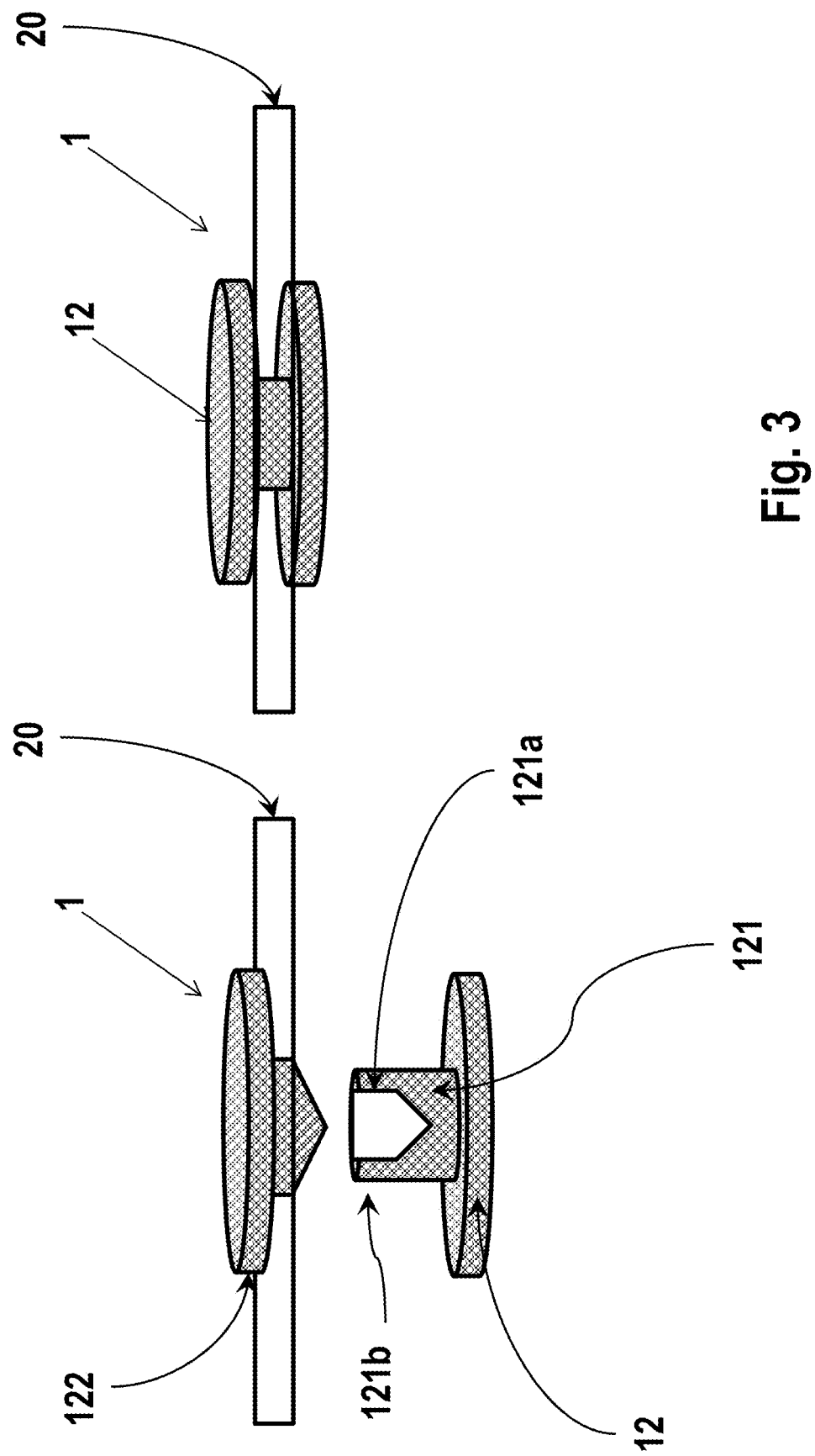
FIG. 3 also shows a rivet according to the present invention in said two states, wherein here the rivet is a semi-tubular rivet comprising a rivet pin and a separate rivet cap that is to be riveted to the rivet pin.

With reference to FIG. 3, the ferromagnetic rivet 12 forming the coil core 12 can be also formed as a semi-tubular rivet 12, comprising a rivet pin 121 and a rivet cap 122. Also here, the rivet cap 122 is initially arranged on the first side 20a of the substrate 20 and the rivet pin 121 is arranged on the second side 20b of the substrate 20 as indicated on the left-hand side of FIG. 3 (of course, the position of the pin 121 and the cap 122 can also be interchanged). The rivet pin 121 comprises a plastically deformable head 121a at a hollow end 121b of the pin 121 that shall be joined to the cap 122. Upon riveting, the substrate 20 is penetrated by the rivet pin 121 and the head 121a of the rivet pin 121 is deformed and joined to the rivet cap 122 so that the ferromagnetic rivet 12 is fastened to the substrate 20 as shown on the right-hand side of FIG. 3. Also here, in case a more rigid substrate 20 is used, the substrate 20 can also be provided with a bore for receiving the rivet pin 121.

Figure 4:
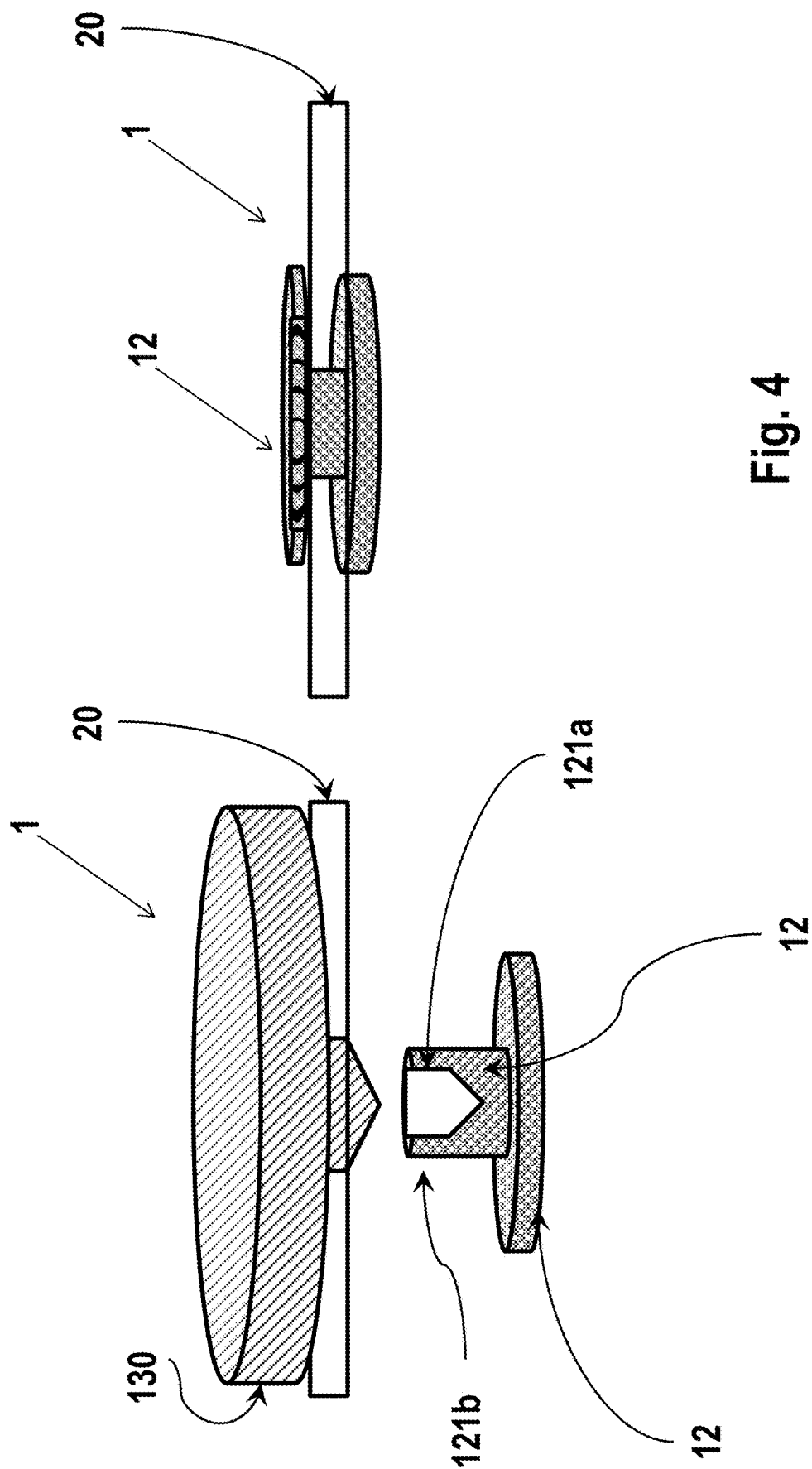
FIG. 4 shows a further rivet according to the present invention and said two states wherein here the rivet is a semi-tubular rivet formed by a single rivet pin that is configured to be riveted to the substrate by means of a mandrel.

According to yet another embodiment, a rivet 12 as shown in FIG. 4 can be used as ferromagnetic coil core 12 of the coil 10 of the assembly 1.

The rivet 12 of FIG. 4 is a semi-tubular rivet pin 12 comprising a plastically deformable rivet head 121a at a hollow end 121b of the semi-tubular rivet pin 12. Again, initially, a mandrel 130 for deforming the pin 12 is arranged on the first side 20a of the substrate 20 and the rivet pin 12 is arranged on the second side 20b of the substrate 20 as indicated on the left-hand side of FIG. 4 (of course, the position of the pin 12 and the mandrel 130 can also be interchanged). The rivet pin 12 comprises a plastically deformable head 121a at a hollow end 121b of the pin 12 that shall be deformed to fasten the rivet 12 to the substrate 20. Upon riveting, the substrate 20 is penetrated by the rivet pin 12 and the head 121a of the rivet pin 12 is deformed by the mandrel 130 to fasten the pin 12 to the substrate 20 as shown on the right-hand side of FIG. 4. Also here, in case a more rigid substrate 20 is used, the substrate 20 can also be provided with a bore for receiving the rivet pin 12.

In the embodiments described above, the respective ferromagnetic rivet 12 (e.g. rivet pin and/or rivet cap 121, 122) can comprise e.g. the following materials (e.g. in the form of particles 12a): AlNiCo, SmCo, $Nd_2Fe_{14}B$, $Ni_{80}Fe_{20}$ ("Permalloy"), or NiFeCo alloys ("Mu-metal"), manganese-zinc ferrites (MnZn), e.g. comprising the composition $Mn_aZn_{(1-a)}Fe_2O_4$ and nickel-zinc ferrites (NiZn), e.g. comprising the composition $Ni_aZn_{(1-a)}Fe_2O_4$.

Furthermore, the ferromagnetic material may be incorporated into a carrier material 12b of the respective rivet 12 (e.g. of the rivet pin 121 and/or of the rivet cap 122). As carrier material basically all plastically deformable, electrically non-conductive plastics or polymers can be used, particularly a liquid crystal polymer (LCP), which can be easily thermally deformed and can be directly bonded to the substrate. Those parts of the rivet 12 that are not plastically deformed can also be formed out of usual ceramic materials.

The present invention provides a simple and affordable method to use comparably large amounts of ferromagnetic material as a core for a flat and spiral coil. A particular advantage of the present invention can be seen when considering the inductive transport of energy. For this, it is advantageous to use coils having a high Quality factor, since the latter has a significant influence on the efficiency of the energy transport.

Figure 6:
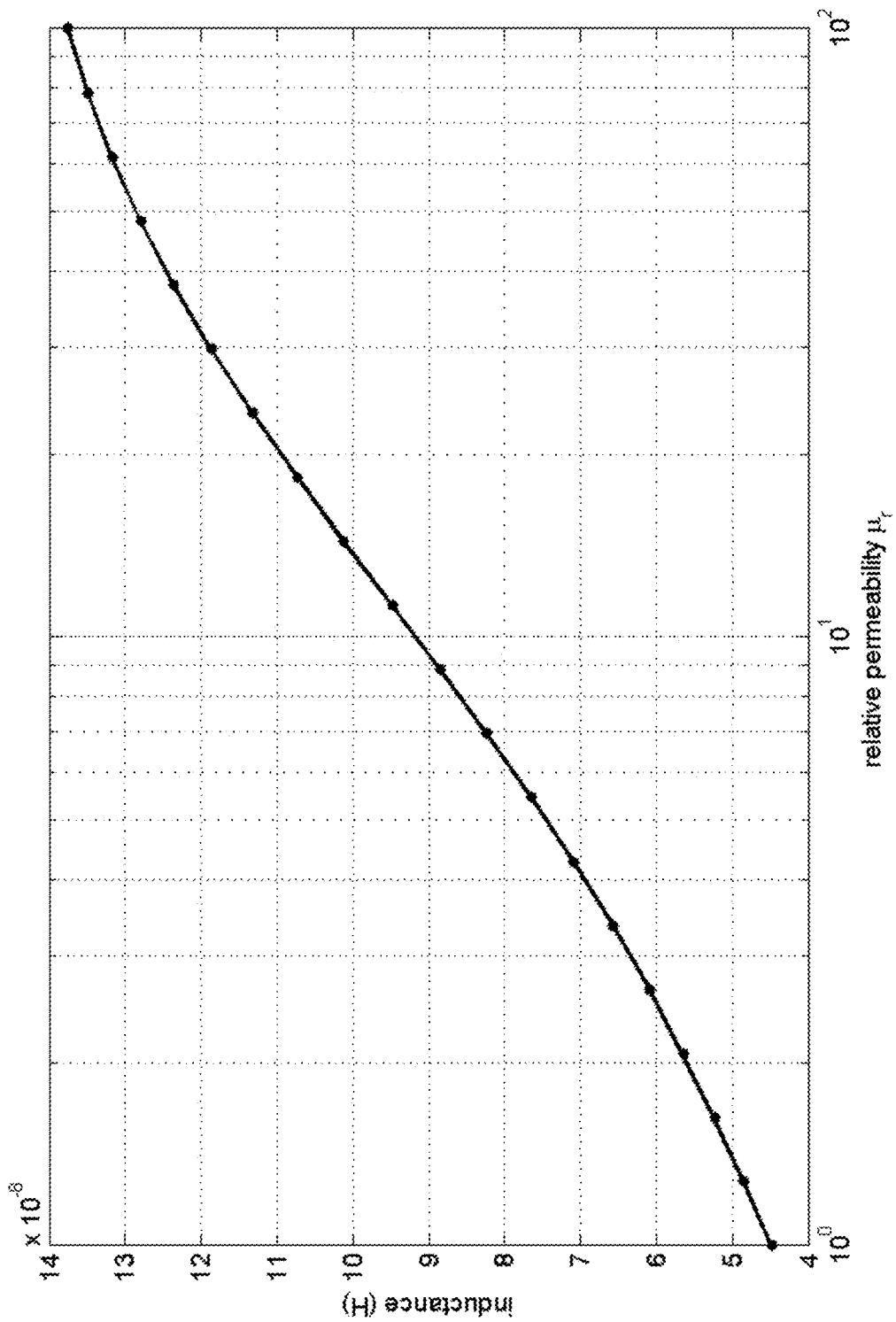
FIG. 6 shows the inductance versus the relative permeability regarding the embodiment shown in FIG. 5.
Figure 7:
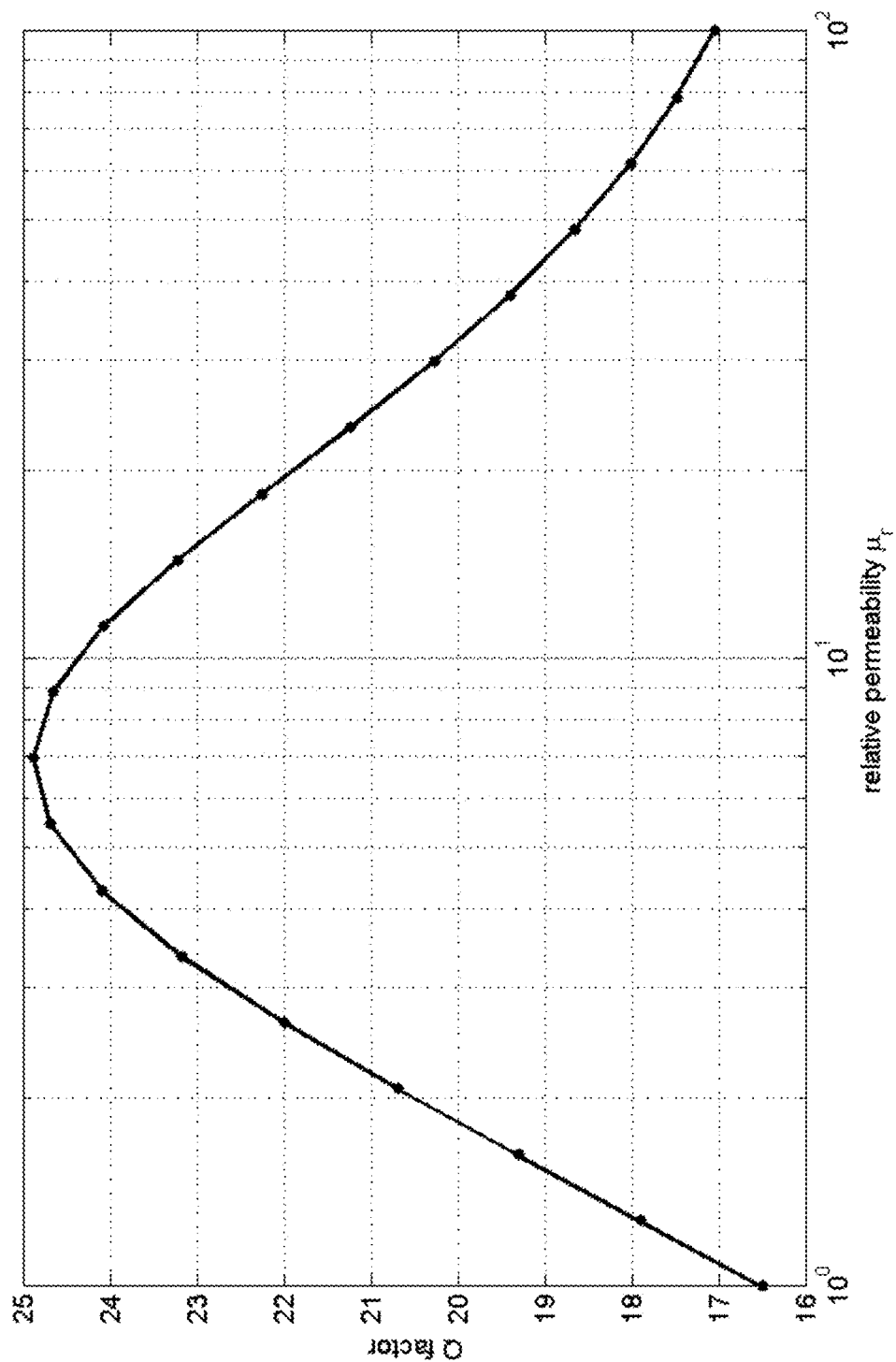
FIG. 7 shows the Quality factor versus the relative permeability regarding the embodiments shown in FIG. 5.

For example, FIG. 6 shows the course of the inductance of the design described above (cf. FIG. 5). As expected, the inductance increases with increasing relative permeability. The Quality factor of this inductor is given by the ratio of reactance and resistance and is shown in FIG. 7. Here, in case of a relative permeability of value 6.95 a clear maximum develops, at which the efficiency of the energy transport becomes maximal.

FIG. 8 shows an assembly 1 with an impedance matching means 30 comprising an electromagnetic coil 10 with a ferromagnetic rivet 12. The assembly further comprises an antennae structure 50 and an integrated circuit (IC) 40. The impedance matching means 30 is configured for impedance matching of the antenna structure 50 with respect to the integrated circuit 40.

The invention claimed is:
1. An assembly, comprising
a substrate;
an electromagnetic coil having a core and a conductor extending along or around said core; and
said core being a ferromagnetic rivet fastened to said substrate.
2. The assembly according to claim 1, wherein said conductor of said coil forms a spiral.
3. The assembly according to claim 1, wherein said substrate is a conductor plate and said conductor is formed by, or comprises, a conductive path arranged on said substrate.
4. The assembly according to claim 3, wherein said conductive path is formed on a first side of said substrate, and said conductor comprises a further conductive path formed on a second side of said substrate, opposite and facing away from the first side.
5. The assembly according to claim 1, wherein said substrate is a flexible substrate.
6. The assembly according to claim 1, wherein said rivet comprises ferromagnetic particles embedded in a carrier material.
7. The assembly according to claim 6, wherein said ferromagnetic particles comprise one of the materials selected from the group consisting of AlNiCo, SmCo, Nd2Fe14B, Ni80Fe20, a NiFeCo alloy, a manganese-zinc ferrite, MnaZn(1-a)Fe2O4, a nickel-zinc ferrite, and NiaZn(1-a)Fe2O4.
8. The assembly according to claim 6, wherein said ferromagnetic particles consist of a material selected from the group consisting of AlNiCo, SmCo, Nd2Fe14B, Ni80Fe20, a NiFeCo alloy, a manganese-zinc ferrite, MnaZn(1-a)Fe2O4, a nickel-zinc ferrite, and NiaZn(1-a)Fe2O4.
9. The assembly according to claim 6, wherein said carrier material is selected from the group consisting of an electrically non-conductive material, an electrically non-conductive plastic or polymer, a liquid crystal polymer, and a ceramic material.
10. The assembly according to claim 1, wherein said rivet is a solid rivet comprising a rivet pin and a rivet cap.
11. The assembly according to claim 1, wherein said rivet is a semi-tubular rivet comprising a rivet pin and a rivet cap.
12. The assembly according to claim 1, wherein said rivet is a semi-tubular rivet pin comprising a plastically deformable rivet head at a hollow end of said semi-tubular rivet pin.
13. The assembly according to claim 1, wherein said electromagnetic coil forms an impedance matching device of the assembly.
14. The assembly according to claim 1, wherein said electromagnetic coil comprises an impedance matching device.
15. The assembly according to claim 14, further comprising an antenna structure and an integrated circuit, and wherein said impedance matching device is configured for impedance matching of said antenna structure with respect to said integrated circuit.

16. The assembly according to claim 1, wherein said electromagnetic coil is configured to form an antenna of the assembly.

17. The assembly according to claim 1, further comprising an antenna, wherein said electromagnetic coil forms a part of said antenna.

18. The assembly according to claim 1, wherein said electromagnetic coil is configured for inductive energy transfer and/or for data transmission.

19. An implantable medical device, comprising the assembly according to claim 1.

20. The implantable medical device according to claim 19, being a pacemaker, a defibrillator, a neurostimulator, a cochlear implant or a retina implant, each with an assembly according to claim 1.

* * * * *